United States Patent
Boerstler et al.

(10) Patent No.: US 6,963,629 B2
(45) Date of Patent: Nov. 8, 2005

(54) ADAPTIVE PHASE LOCKED LOOP

(75) Inventors: David W. Boerstler, Round Rock, TX (US); Gary D. Carpenter, Pflugerville, TX (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 821 days.

(21) Appl. No.: 09/918,809

(22) Filed: Jul. 31, 2001

(65) Prior Publication Data

US 2003/0026372 A1 Feb. 6, 2003

(51) Int. Cl.$^7$ .............................. H03D 3/24; H03L 7/06
(52) U.S. Cl. ..................... 375/376; 375/374; 375/375; 327/148; 327/157
(58) Field of Search ............................... 331/8, 25, 17, 331/16, 11; 375/376, 371, 326; 332/110; 327/156

(56) References Cited

U.S. PATENT DOCUMENTS

| | | | | |
|---|---|---|---|---|
| 5,276,408 A | * | 1/1994 | Norimatsu | 331/8 |
| 5,473,285 A | * | 12/1995 | Nuckolls et al. | 331/1 A |
| 6,018,556 A | * | 1/2000 | Janesch et al. | 375/376 |
| 6,031,428 A | * | 2/2000 | Hill | 331/11 |
| 6,121,845 A | * | 9/2000 | Eribes | 331/25 |
| 6,208,216 B1 | * | 3/2001 | Nasila | 332/110 |
| 6,580,328 B2 | * | 6/2003 | Tan et al. | 331/17 |
| 6,597,754 B1 | * | 7/2003 | Janesch et al. | 375/376 |

OTHER PUBLICATIONS

Joonsuk Lee et al., "A Low–Noise Fast–Lock Phase–Locked Loop with Adaptive Bandwidth Control," *IEEE Journal of Solid–State Circuits*, vol. 35, No. 8, Aug. 2000, pp. 1137–1145.

Gyoung–Tae Roh et al., "Optimum Phase–Acquistion Technique for Charge–Pump PLL," *IEEE Transactions on Circuits and Systems–II: Analog and Digital Signal Processing*, vol. 44, No. 9, Sep. 1997, pp. 729–740.

Masayuki Mizuno et al., "CMOS Hot–Standby Phase–Locked Loop Using a Noise–Immune Adaptive–Gain Voltage–Controlled Oscillator," *1995 IEEE International Solid–State Circuits Conference*, pp. 268–270.

(Continued)

*Primary Examiner*—Stephen Chin
*Assistant Examiner*—Linda Wong
(74) *Attorney, Agent, or Firm*—Richard F. Frankeny; Winstead Sechrest & Minick P.C.; Casimer K. Salys

(57) ABSTRACT

A reference signal and a voltage controlled oscillator (VCO) output are compared for relative phase and frequency differences. A lead error signal is generated if the reference signal leads the VCO output and a lag error signal is generated if the reference signal lags the VCO output the lead and lag error may result from a combination for phase and frequency differences between the reference signal and the VCO output. A time window is used to sample the polarity of the lead and lag error signals by incrementing and decrementing a phase error signal. If the phase error signal reaches a threshold value within the time window, a Reset Delta pulse is generated and if the phase error signals does not reach the maximum delta value within the time window a Reset Total pulse is generated. A variable first gain signal is increased on each Reset Delta pulse and decreased on each Reset Total pulse and limited to a value between predetermined maximum and minimum values. The first gain signal is multiplied by a Pump current increment and added to a minimum Pump current to generate a variable Pump current. A variable second gain signal proportional to the time the reference signal leads and lags the VCO signal multiplies the Pump current. The amplified Pump current is summed with an integral of the amplified Pump current to generate a control signal. The control signal is applied to the VCO and determines the frequency of the VCO output.

32 Claims, 7 Drawing Sheets

OTHER PUBLICATIONS

Rafael Fried et al., "Low–Power Digital PLL with One Cycle Frequency Lock–In Time and Large Frequency–Multiplication Factor for Advanced Pwer Management," *ICECS '96*, pp. 1166–1169.

Helmuth Brugel et al., "Variable Bandwidth DPLL Bit Synchronizer with Rapid Acquistion Implemented as a Finite State Machine," *IEEE Transactions on Communications*, vol. 42, No. 9, Sep. 1994, pp. 2751–2759.

* cited by examiner

US 6,963,629 B2

ADAPTIVE PHASE LOCKED LOOP

TECHNICAL FIELD

The present invention relates in general to phase locked loop systems for generating computer clocks.

BACKGROUND INFORMATION

Phase-locked loops (PLL's) have been widely used in high-speed communication systems because PLL's efficiently perform clock recovery or clock generation at a relatively low cost. PLL's used in systems to generate clocks are required to generate low-noise or low jitter clock signals. Conventional analog PLL's may use a narrow-band loop filter to reduce output jitter at the expense of extended locking time. In order to improve locking-time characteristics, digital or hybrid analog/digital PLL's have been used which employ varying algorithms to modify loop bandwidth depending on whether a frequency lock is being acquired or maintained.

For low power microprocessor and handheld device applications it is desirable to shut off the unit's clock generator for power savings. However, the time required for the unit to "wake-up" may be excessive since a phase-locked loop (PLL) clock source may require a long period of time to achieve the desired steady-state conditions. Conventional design approaches for a PLL may reduce acquisition time (i.e., the time required to achieve frequency and phase locked conditions from an initially unlocked state) at the expense of steady state jitter, but this will increase the system cycle time budget. Adaptive PLL techniques have been reported, but often include complex system issues, require additional custom circuit designs, or involve higher-jitter digital PLL techniques.

There is, therefore, a need for a simple adaptive PLL that has fast acquisition time and low jitter while requiring simple hardware to implement.

SUMMARY OF THE INVENTION

An adaptive phase-locked loop (PLL) compares the phase and frequency of a reference signal and the output of a voltage-controlled oscillator (VCO) and generates a lead error signal if the reference signal leads the VCO output and a lag error signal if the reference signal lags the VCO output. A time window is generated and a phase error signal is increased on a transition of the lead error signal and decreased on a transition of the lag error signal. A variable first gain signal is increased if the phase error signal reaches a predetermined value during a time window and the first gain signal is decreased if the phase error signal does not reach the predetermined value. The first gain signal is limited to a value between predetermined minimum and maximum values. A Pump increment signal is multiplied times the first gain signal and added to a Pump minimum signal to generate a Pump signal. A second gain signal is generated as a plus one value for the duration of the lead error signal and a minus one value for the duration of the lag error signal. The Pump signal is multiplied times the second gain signal to generate a modified Pump signal. The modified Pump signal multiplied by a first constant is added to the integral of the modified Pump signal multiplied by a second constant to generate a Control signal. The Control signal is applied as the frequency control voltage of a VCO generating the VCO output.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
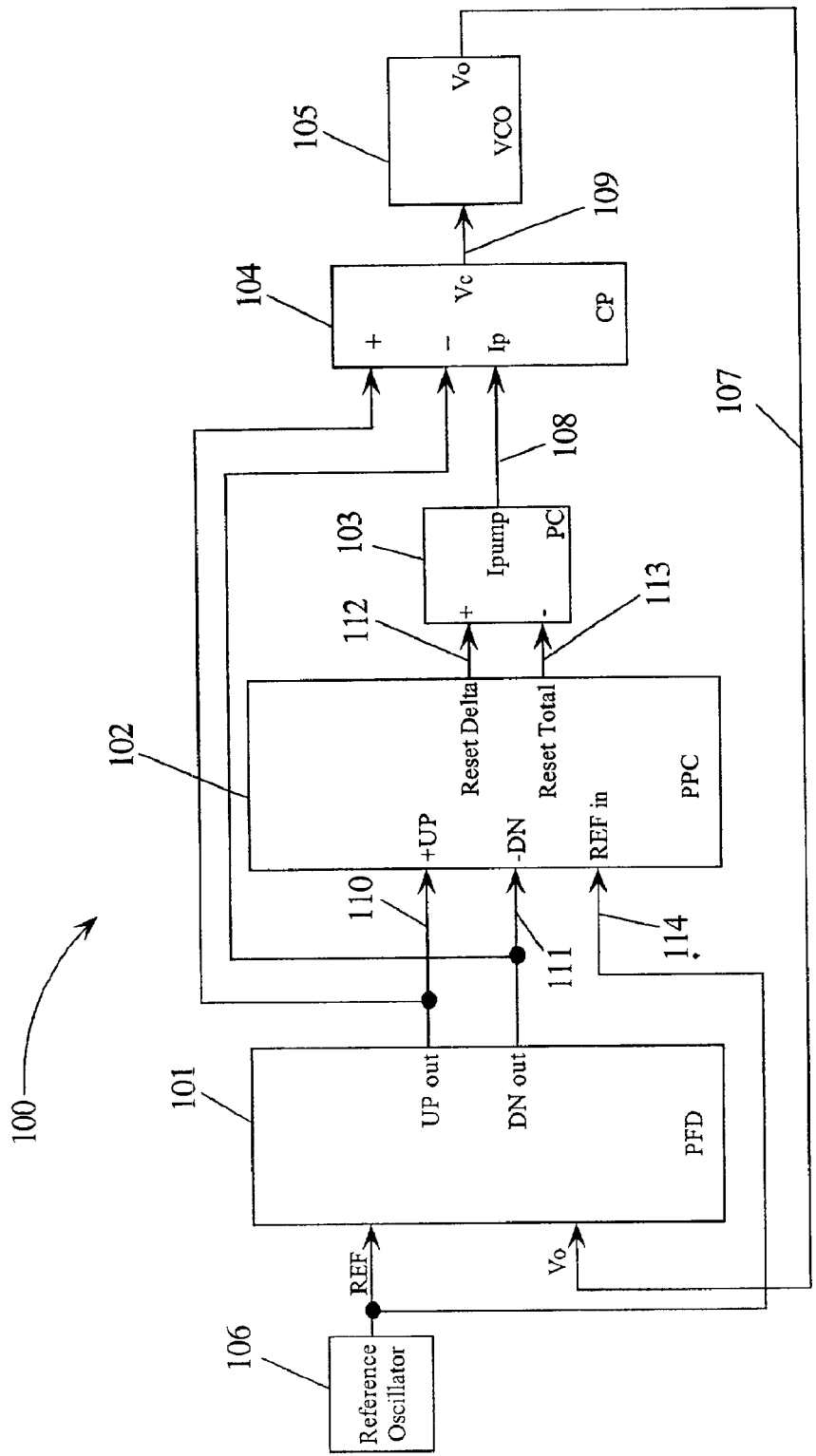
FIG. 1 is a block diagram of an adaptive phase-locked loop according to embodiments of the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following detailed descriptions, a logic zero is a low or zero voltage and a logic one is a high or a plus supply voltage to simplify explanation of embodiments of the present invention.

FIG. 1 is a block diagram of an adaptive PLL 100 according to embodiments of the present invention. Phase/frequency detector (PFD) 101 receives a signal REF 114 from reference oscillator 106 and an output Vo 107 from voltage-controlled oscillator (VCO) 105. PFD 101 generates two output signals, UP 110 and DN 111. UP 110 is a lead phase error signal which is a logic one during a cycle if the phase of REF 114 leads Vo 107 and DN 111 is a lag error signal which is a logic one during a cycle if the phase of REF 114 lags Vo 107. UP 110 and DN 111 are used as up/down count inputs to Phase Polarity counter (PPC) 102 that inputs to charge pump CP 104. PPC 102 has counter circuits that count REF 114 and generate two signals, Reset Delta 112 and Reset Total 113, which are used in Pump Counter (PC) 103 to generate a variable current Ipump 108. Charge-Pump (CP) 104 receives Ipump 108, UP 110, and DN 111 and generates the control voltage Vc 109 that sets the frequency of output Vo 107. The generation of a variable charge pump current Ipump 108 which is in turn used in a charge-pump circuit 104 to produce a control voltage Vc 109 for VCO 105 is one embodiment of the present invention. The control of variable current Ipump 108 and thus the response of Vc 109 to the dynamic phase and frequency differences in Vo 107 and REF 114 is another embodiment of the present invention and will be further explained in the following detailed description.

The PLL 100 system in FIG. 1 first generates lead and lag phase error signals UP 110 and DN 111, respectively. The lead and lag phase error signals are used to generate phase error signal input to PPC 102 which is proportional to the relative difference between the number of cycles during which REF 114 leads Vo 107 and the number of cycles during which REF 114 lags Vo 107. The phase error signal is increased when the lead error signal is present and decreased when the lag error signal is present (only one is present during a cycle). The absolute value of this phase error signal is compared to a threshold value. Likewise, each cycle of REF 114 is used to generate a time window (corresponding to a number of cycles of REF 114). If the absolute value of the phase error signal reaches its threshold value before the time window is reached, then a first variable gain signal is increased. If the absolute value of the phase error signal fails to reach the threshold in the time window, then the first variable gain signal is decreased. A current, Ipump 108, is generated by multiplying a first reference current by the first variable gain and adding it to a second reference current. The first variable gain is limited to a value between a predetermined maximum and a predetermined minimum value. A second variable gain signal (SVG) is generated from the lead and lag error signals UP 110 and DN 111, respectively. When UP 110 is a logic one, SVG has a value of +K and when the DN 111 is a logic one, SVG has a value of −K. Embodiments of the present invention use K=1. SVG multiplies ipump 108 to generate a modified pump current (MPC) in charge pump CP 104. MPC is processed in CP 104 to generate Vc 109. In embodiments of the present invention, Vc 109 is generated by multiplying MPC by a first constant and adding it to the integral of MPC multiplied by a second constant. Vc 109 is then applied as the voltage control that sets the frequency of the output of VCO 105 that generates Vo 107. Vo 107 is compared to the REF 114 in the PFD 101 thus closing the feedback loop of PLL 100.

Figure 2:
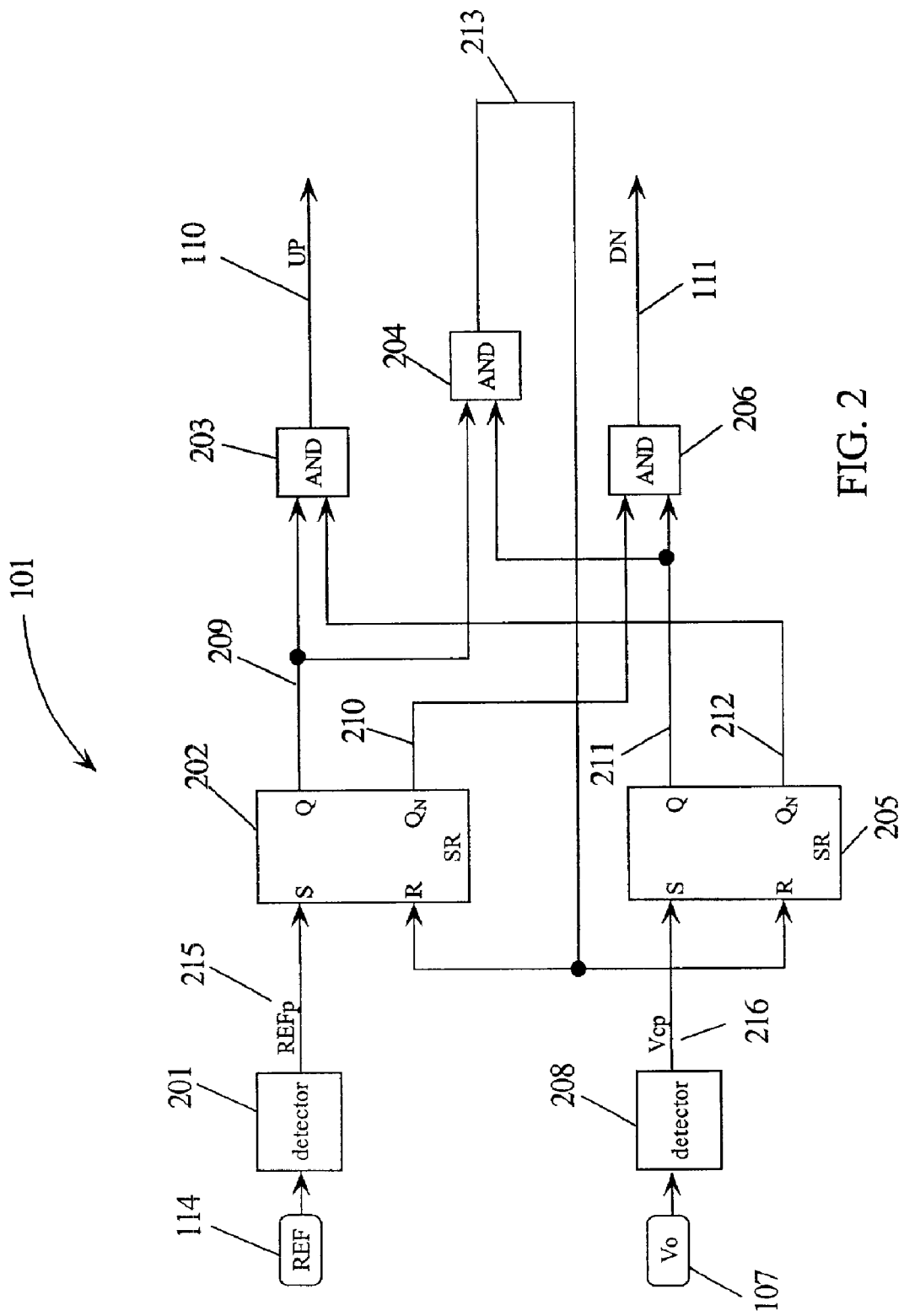
FIG. 2 is a block diagram of a phase/frequency detector with additional components added to simulate dead-zone and spurious outputs.

FIG. 2 is a block diagram of circuit functions used to generate logic output signals UP 110 and DN 111 in PFD 101. Since REF 114 and Vo 107 may be analog signals, detectors 201 and 208 are used to shape signal transitions. Detectors 201 and 208 are circuits that generate a logic output when the input signal crosses a specified value in a specified signal transition direction. For example, a zero crossing detector may generate a logic one pulse when a signal crosses zero volts with a positive slope. The outputs REFp 215 and Vcp 216, of detectors 201 and 208 respectively, are coupled to the set inputs of set/reset (SR) latches 202 and 205, respectively. When SR 202 is set, its output Q 209 is a logic one and its output $Q_N$ 210 is a logic zero. SR 202 is set by the output 215 of detector 201 and reset by an output 213 of AND circuit 204. Likewise SR 205 is set by the output 216 of detector 208 and reset by output 213 of AND circuit 204. The reset via output 213 is removed whenever either output, Q 209 or Q 211, is a logic zero. If at any time Q 209 and Q 211 have concurrent opposite logic states, then REF 114 and Vc 107 cannot be in phase. As soon as both Q 209 and Q 211 are in a logic one state, both latch 202 and latch 205 are reset via output 213. If REF 114 leads Vc 107, then UP 110 will have an output and DN 111 will be a logic zero, likewise, if Vc 107 leads REF 114, then DN 111 will have an output and UP 110 will be a logic zero. UP 110 and DN 111 are pulse signals that are produced on cycles of REF 114 and VCO 107 where logic conditions of logic AND 203 and logic AND 204 are satisfied. REF 114 and Vc 107 may be in an out of phase condition because of a difference in frequency or a difference in phase angle.

Figure 4:
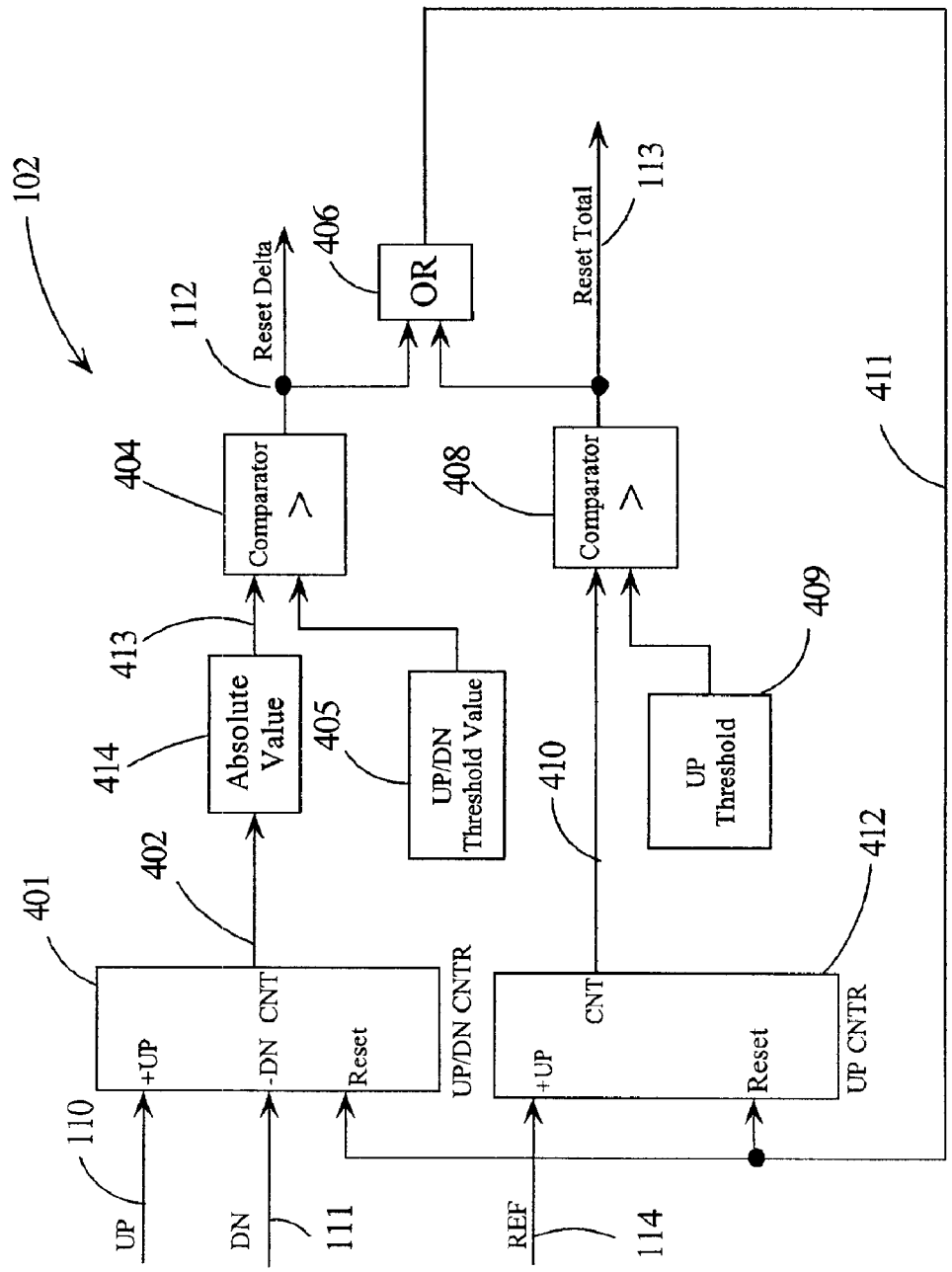
FIG. 4 is a block diagram of a phase polarity counter according to embodiments of the present invention.

FIG. 4 is a block diagram of PPC 102. Signals UP 110 and DN 111 are coupled to the corresponding count UP and count Down (DN) inputs of UP/DN counter 401. UP/DN counter 401 is reset with PPC 102 output 411. A transition on UP 110 is (REF 114 leads Vc 107) counted in UP/DN counter 401 and generates an increased count on output 402, and a transition on DN 111 decreases the count on output 402. Output 402 is converted to an absolute value in circuit 414 and generates an absolute count difference 413. Count difference 413 is compared to an UP/DN Threshold value 405 in comparator circuit 404. Comparator 404 generates Reset Delta 112 as a logic one whenever the count on output 413 is greater than UP/DN Threshold 405. UP counter 412 counts REF 114 and generates count output 410 which is compared to UP Threshold value 409 in comparator circuit 408. If the count of counter output 410 is greater than UP Threshold 409, then Reset Total 113 generates a logic one. If either UP/DN Threshold 405 or UP THRESHOLD 409 is exceeded, OR circuit 406 generates a logic one. A logic one on output 411 resets both UP counter 412 and UP/DN counter 401. Comparator 404 determines if the difference between the number of UP count events (UP 110) and the number of Down count events (DN 111) exceeds the UP/DN Threshold 405 value regardless of the polarity of the difference. Comparator 404 determines a frequency error band which affects how much compensation the control loop applies to VCO 105. Comparator 408, on the other hand, just determines when a number of cycles of REF 114 (a time window) exceed the UP Threshold value 409.

Figure 5:
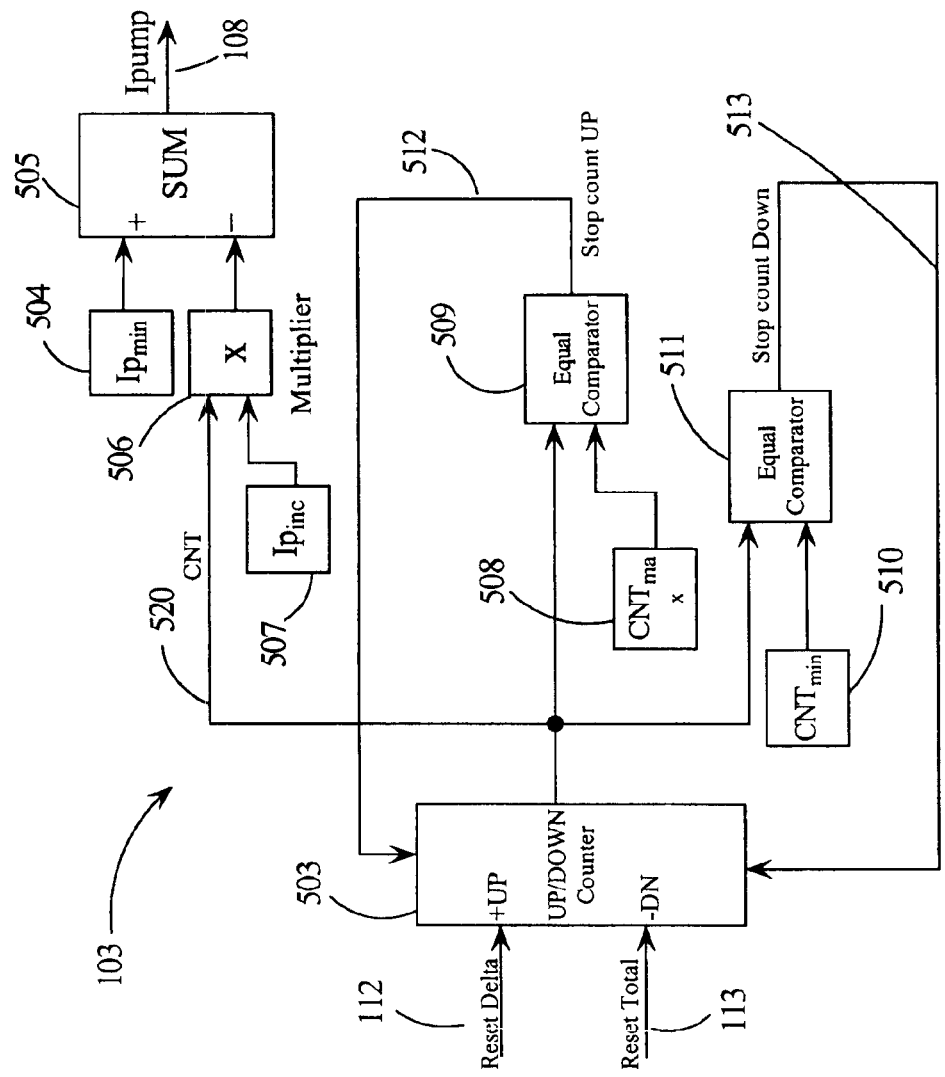
FIG. 5 is a block diagram of a charge pump counter according to embodiments of the present invention.

FIG. 5 is a block diagram of Pump counter 103 which generates Ipump 108 in response to signals Reset Delta 112 and Reset Total 113, a minimum current IPmin 504 and an increment current IPinc 507. Ipump 108 is a current generated by adding, in Sum 505, minimum current IPmin 504 to a scaled value of increment current IPinc 507. IPinc 507 is scaled in multiplier 506 by the count (CNT) 520 of UP/DN counter 503. CNT 520 is incremented by one each time a pulse is received from Reset Delta 112 and decremented by one each time a pulse is received from Reset Total 113. Registers CNTmax 508 and CNTmin 510 are maximum and minimum count limits established for counter 503. CNTmax 508 is compared to CNT 520 in comparator 509 and generates a Stop UP 512 signal when CNTmax 508 and CNT 520 are equal. Stop count UP 512 is fed back to stop counter 503 from counting up. CNT min 510 is compared to CNT 520 in comparator 511 and generates a Stop count Down 513 signal when CNT min 510 and CNT 520 are equal. Stop count Down 513 is fed back to stop counter 503 from counting down. Ipump 108 varies as function of CNT 520 and CNT 520 is bounded between count values of CNTmax 508 and CNTmin 510.

Figure 3:
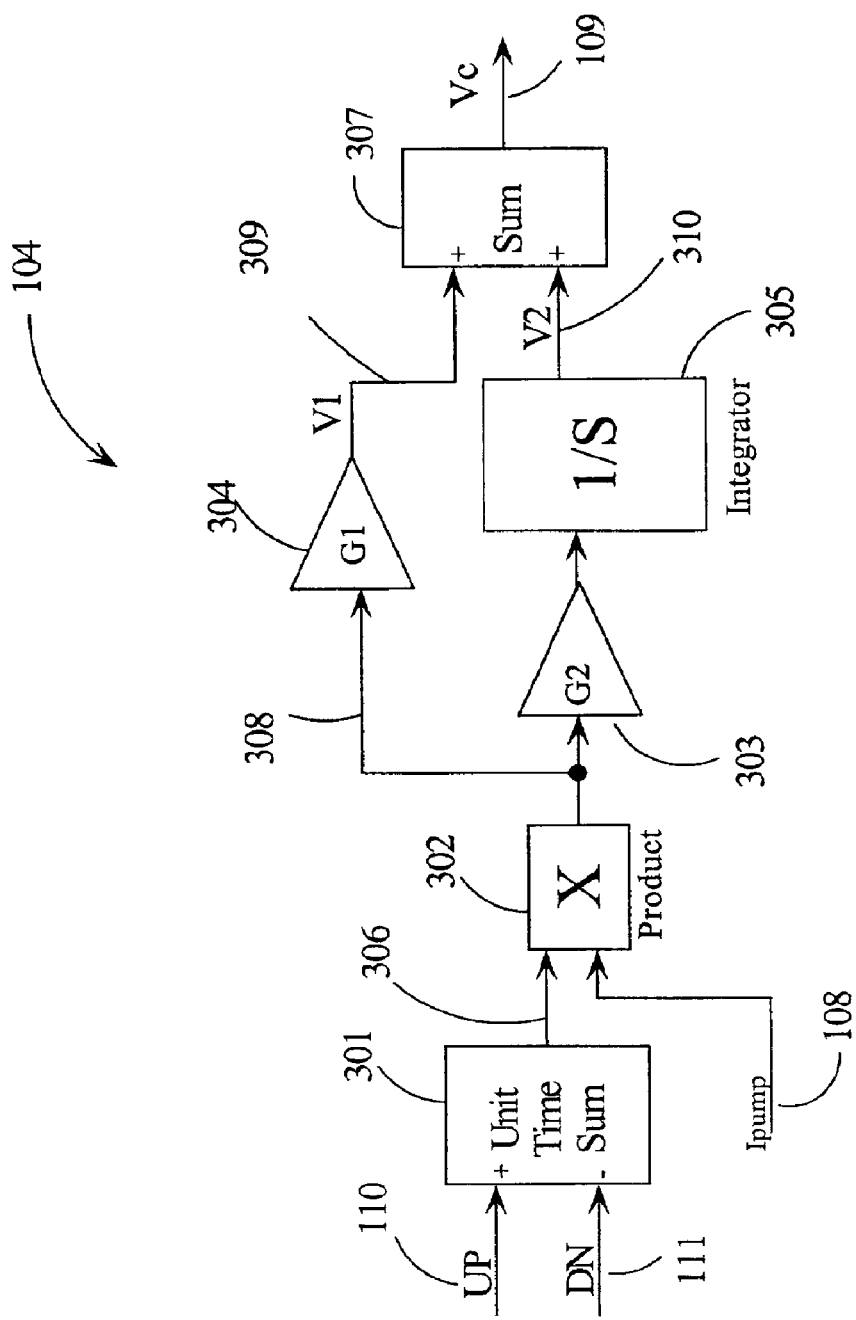
FIG. 3 is a block diagram of a programmable charge pump according to embodiments of the present invention.

FIG. 3 is a charge pump circuit according to embodiments of the present invention which accepts the variable current Ipump 108 and generates control voltage Vc 109 used to control the frequency of output Vo 107. Charge pump 104 receives signals UP 110 and DN 111 in the "time sum" (TS) circuit 301 and generates output TS 306. TS 306 has a value of plus one for the duration that UP 112 is a logic one and a value of minus one for the duration that DN 113 is a logic one. TS 306 is multiplied by Ipump 108 in multiplier 302 and generates output 308. Output 308 is multiplied by gain 304 (G1) and generates a voltage V1 309 equal to G1 times output 308. Output 308 is also multiplied by gain 303 (G2) and integrated by integrator 305 producing voltage V2 310. V1 309 and V2 310 are added in Sum 307 to produce control voltage Vc 109. Control voltage Vc 109 controls VCO 105 and determines the frequency of the output Vo 107.

Figure 6:
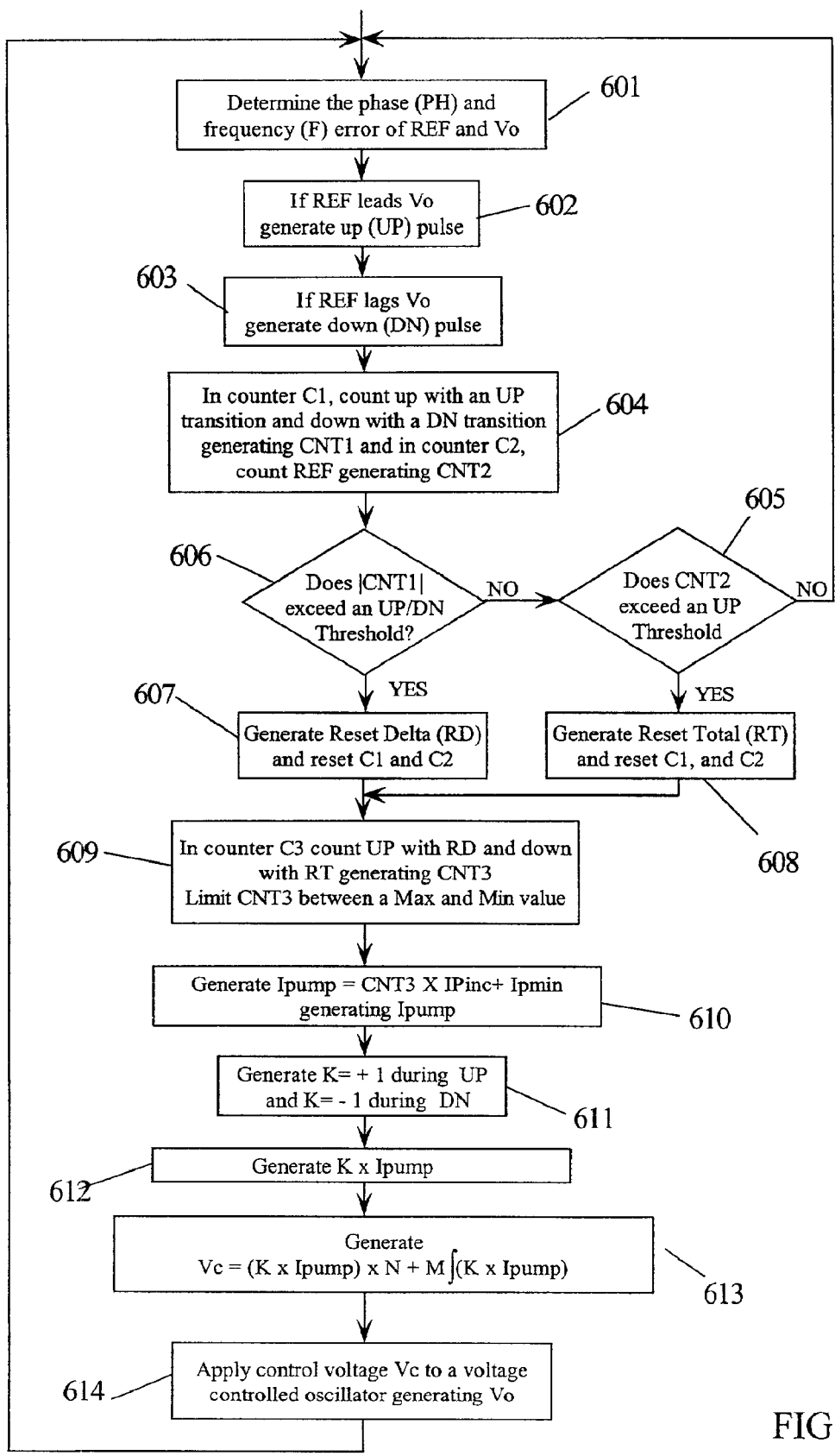
FIG. 6 is a flow diagram of method steps in one embodiment of the present invention.

FIG. 6 is a flow diagram of method steps in an embodiment of the present invention. In step 601, the phase and frequency error between signal REF 114 and Vo 107 are determined. In step 602, a signal UP 110 is generated if REF 114 leads Vo 107. In step 603, a signal DN 111 is generated if REF 114 lags Vo 107. In step 604, a counter 401 (C1) increases in response to a transition on UP 110 and decreases in response to a transition on DN 111 generating count CNT 402 (CNT1) and counter 412 is counted up in response to REF 114 generating count CNT 410 (CNT2). In step 606, a test is done to determine if the absolute value of CNT 402 exceeds an UP/DN Threshold 405. If the result of the test in step 606 is NO, then in step 605 a test is done to determine if CNT 410 exceeds an UP Threshold 409. If the result of the test in step 605 is NO, then a branch is taken back to step 601. If the result of the test in step 606 is YES, then in step 607, Reset Delta 112 is generated and counters 401 and 412 are reset. If the result of the test in step 605 is YES, then in step 608 Reset Total is generated and counters 401 and 412 are reset. In step 609, counter 503 (C3) counts up with Reset Delta 112 and down with Reset Total generating CNT 520 (CNT3) and limit CNT 520 between a minimum count (CNTmin 510) and a maximum count (CNTmax 508). In step 610, CNT 520 multiplies a current increment Ipinc 507 and is added to a minimum current Ipmin 504 generating an Ipump current 108. In step 611, a time sum (TS) 306 is generated as a plus one during the time UP 110 is a logic one a minus one during the time DN 111 is a logic one. In step 612, TS 306 is multiplied by Ipump 108 generating TS 306 times Ipump 108. In step 613, TS 306 multiplied by Ipump 108 is multiplied by a gain G1 and added to the integration of TS 306 multiplied by Ipump 108 multiplied by a gain G2 generating control voltage Vc 109. In step 614, Vc 109 is applied to a VCO 105 generating Vo 107 to control the frequency of Vo 107. A branch is then taken back to step 601.

Figure 7:
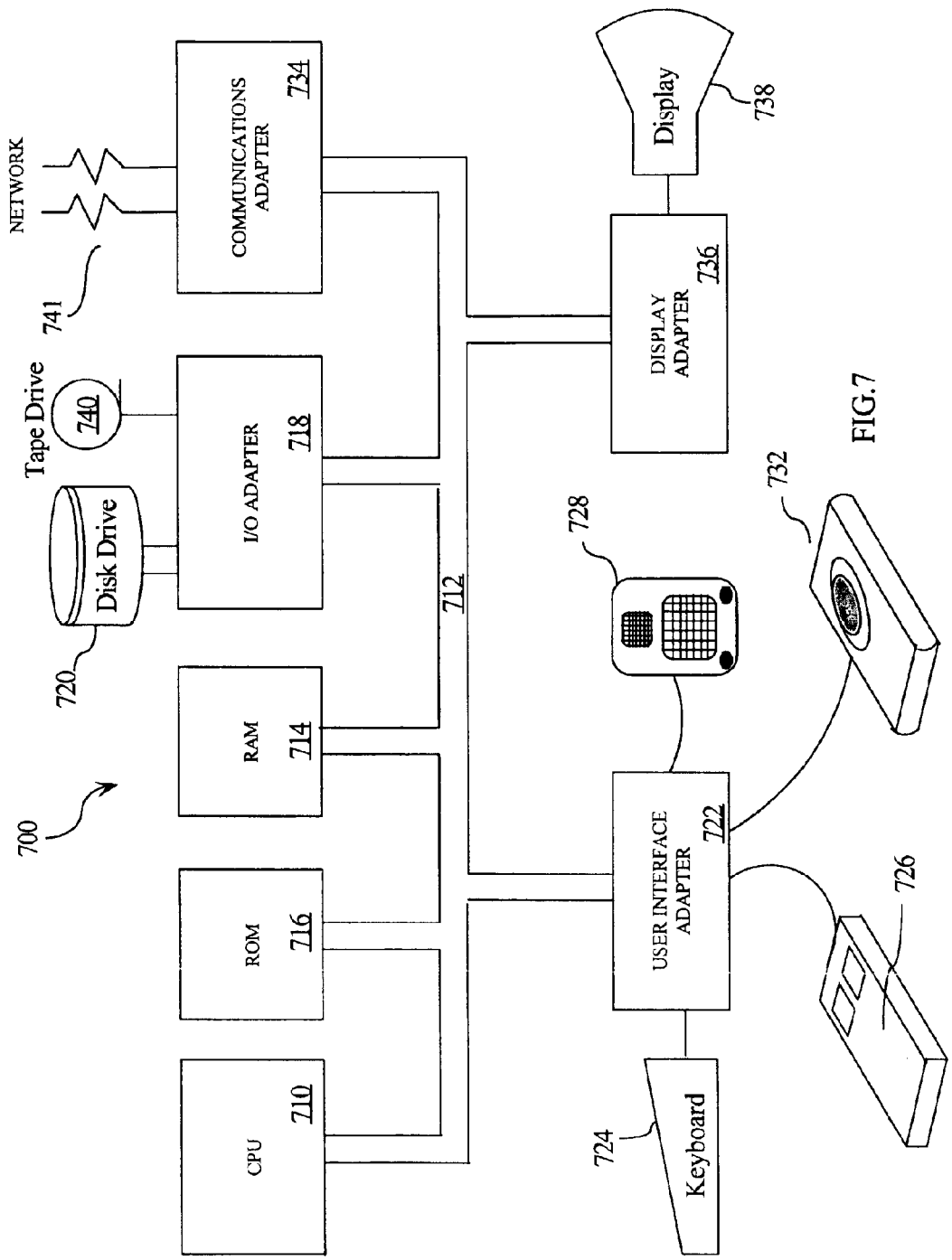
FIG. 7 is a block diagram of a data processing system configured to use embodiments of the present invention in clock generation.

FIG. 7 is a high level functional block diagram of a representative data processing system 700 suitable for practicing the principles of the present invention. Data processing system 700, includes a central processing system (CPU) 710 operating in conjunction with a system bus 712. System bus 712 operates in accordance with a standard bus protocol, such that as the ISA protocol, compatible with CPU 710. CPU 710 operates in conjunction with electronically erasable programmable read-only memory (EEPROM) 716 and random access memory (RAM) 714. Among other things, EEPROM 716 supports storage the Basic Input Output System (BIOS) data and recovery code. RAM 714 includes, DRAM (Dynamic Random Access Memory) system memory and SRAM (Static Random Access Memory) external cache. 110 Adapter 718 allows for an interconnection between the devices on system bus 712 and external peripherals, such as mass storage devices (e.g., a hard drive, floppy drive or CD/ROM drive), or a printer 740. A peripheral device 720 is, for example, coupled to a peripheral control interface (PCI) bus, and 110 adapter 718 therefore maybe a PCI bus bridge. User interface adapter 722 couples various user input devices, such as a keyboard 724, mouse 726, touch pad 732 or speaker 728 to the processing devices on bus 712. Display 738 which may be, for example, a cathode ray tube (CRT), liquid crystal display (LCD) or similar conventional display units. Display adapter 736 may include, among other things, a conventional display controller and frame buffer memory. Data processing system 700 may be selectively coupled to a computer or telecommunications network 741 through communications adapter 734. Communications adapter 734 may include, for example, a modem for connection to a telecom network and/or hardware and software for connecting to a computer network such as a local area network (LAN) or a wide area network (WAN). CPU 710 and other components of data processing system 700 may contain a PLL loop for generating clocks according to embodiments of the present invention.

The present invention and its advantages have been described in detail, it should be understood that various changes, substitutions and alterations can be made herein without departing from the spirit and scope of the invention as defined by the appended claims.

What is claimed is:

1. A method for controlling a phase locked loop in a computer system clock generator comprising the steps of:

generating a lead error signal when a first signal leads a second signal and a lag error signal when said first signal lags said second signal;

generating a phase error signal in response to said lead error signal and said lag error signal;

generating a variable first gain signal in response to said phase error signal and said first signal;

generating a variable second gain signal in response to said lead error signal and said lag error signal;

generating a control signal in response to a first reference signal, a second reference signal, said first gain signal and said second gain signal; and applying said control signal to a voltage controlled oscillator as a frequency control signal of an output of a voltage controlled oscillator generating said second signal.

2. The method of claim 1, wherein said lead error signal is a logic one pulse if said first signal leads said second signal during a cycle of said second signal and said lag error signal is a logic one pulse if said first signal lags said second signal during said cycle of said second signal.

3. The method of claim 1, wherein said phase error signal is increased on a transition of said lead error signal and decreased on a transition of said lag error signal.

4. The method of claim 1, wherein said first gain signal is increased if an absolute value of said phase error signal reaches a first threshold value within a time window and decreased if said absolute value of said phase error signal does not reach said first threshold value in said time window.

5. The method of claim 1, wherein said second gain signal is a value +K if said lead error signal is a logic one pulse and a value −K if said lag error signal is a logic one pulse, wherein K is a numerical value including the value one.

6. The method of claim 1, wherein said first gain signal is limited to a magnitude between a predetermined maximum level and a predetermined minimum level.

7. The method of claim 6, wherein a third signal is generated by adding said first reference signal to said second reference signal multiplied by said first gain signal.

8. The method of claim 7, wherein said control signal is generated in response to said third signal, an integral of said third signal, and said second gain signal.

9. The method of claim 8, wherein said third signal is multiplied by said second gain signal generating a modified third signal.

10. The method of claim 9, wherein said control signal is generated by adding said modified third signal multiplied by a first constant to an integral of said modified third signal multiplied by a second constant.

11. The method of claim 4, wherein said first threshold value and said time window are dynamically variable.

12. A phase locked loop (PLL) comprising:
phase comparator receiving a first signal and a second signal and generating a lead error signal when said first signal leads said second signal and a lag error signal when said first signal lags said second signal;
a phase error generator for generating a phase error signal in response to said lead error signal and said lag error signal;
a circuit for generating a variable first gain signal in response to said phase error signal and said first signal;
a circuit for generating a variable second gain signal in response to said lead error signal and lag error signal;
a circuit for generating a control signal in response to a first reference signal, a second reference signal, said first gain signal and said second gain signal; and
a voltage controlled oscillator receiving said control signal as a frequency control signal of an output of said voltage controlled oscillator generating said second signal.

13. The PLL of claim 12, wherein said lead error signal is a logic one pulse; if said first signal leads said second signal during a cycle of said second signal and said lag error signal is a logic one pulse; if said first signal lags said second signal during said cycle of said second signal.

14. The PLL of claim 12, wherein said phase error signal is increased on a transition of said lead error signal and decreased on a transition of said lag error signal.

15. The PLL of claim 12, wherein said first gain signal is increased if an absolute value of said phase error signal reaches a first threshold value within a time window and decreased if said absolute value of said phase error signal does not reach said first threshold value in said time window.

16. The PLL of claim 12, wherein said second gain signal is a value +K if said lead error signal is a logic one pulse and a value −K if said lag error signal is a logic one pulse, wherein K is a numerical value including the value one.

17. The PLL of claim 12, wherein said first gain signal is limited to a magnitude between a predetermined maximum level and a predetermined minimum level.

18. The PLL of claim 17, wherein a third signal is generated by adding said first reference signal to said second reference signal multiplied by said first gain signal.

19. The PLL of claim 18, wherein said control signal is generated in response to said third signal, an integral of said third signal, and said second gain signal.

20. The PLL of claim 19, wherein said third signal is multiplied by said second gain signal generating a modified third signal.

21. The PLL of claim 20, wherein said control signal is generated by adding said modified third signal multiplied by a first constant to an integral of said modified third signal multiplied by a second constant.

22. The PLL of claim 15, wherein said first threshold value and said time window are dynamically variable.

23. A data processing system comprising:
a processor central processing unit (CPU);
a random access memory (RAM);
a read only memory (ROM); and
a bus system coupling said CPU to said ROM and said RAM, said data processing system further comprising a phase locked loop (PLL) in clock a generator, said PLL comprising:
circuitry for receiving a first signal and a second signal and generating a lead error signal when said first signal leads said second signal and a lag signal when said first signal lags said second signal;
circuitry for generating a phase error signal in response to said lead error signal and said lag error signal;
circuitry for generating a variable first gain signal in response to said phase error signal;
circuitry for generating a variable second gain signal in response to said lead error signal and lag error signal;
circuitry for generating a control signal in response to a first reference signal, a second reference signal, said first gain signal and said second gain signal; and
a voltage controlled oscillator receiving said control signal as a frequency control signal for an output of said voltage controlled oscillator generating said second signal.

24. The data processing system of claim 23, wherein said lead error signal is a logic one pulse if said first signal leads said second signal during a cycle of said second signal and said lag error signal is a logic one pulse if said first signal lags said second signal during said cycle of said second signal.

25. The data processing system of claim 23, wherein said phase error signal is increased on a transition of said lead error signal and decreased on a transition of said lag error signal.

26. The data processing system of claim 23, wherein said first gain signal is increased if an absolute value of said phase error signal reaches a first threshold value within a time window and decreased if said absolute value of said phase error signal does not reach said first threshold value in said time window.

27. The data processing system of claim 23, wherein said second gain signal is a value +K if said lead error signal is a logic one pulse and a value −K if said lag error signal is a logic one pulse, wherein K is a numerical value including the value one.

28. The data processing system of claim 23, wherein said first gain signal is limited to a magnitude between a predetermined maximum level and a predetermined minimum level.

29. The data processing system of claim 28, wherein a third signal is generated by adding said first reference signal to said second reference signal multiplied by said first gain signal.

30. The data processing system of claim 29, wherein said control signal is generated in response to said third signal, an integral of said third signal, and said second gain signal.

31. The data processing system of claim 30, wherein said third signal is multiplied by said second gain signal generating a modified third signal.

32. The data processing system of claim 31, wherein said control signal is generated by adding said modified third signal multiplied by a first constant to an integral of said modified third signal multiplied by a second constant.

* * * * *